United States Patent
Blackburn et al.

(10) Patent No.: US 6,888,313 B2
(45) Date of Patent: May 3, 2005

(54) IMPEDANCE MATCHING NETWORK WITH TERMINATION OF SECONDARY RF FREQUENCIES

(75) Inventors: Thomas Joel Blackburn, Fort Collins, CO (US); Christopher C. Mason, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 103 days.

(21) Appl. No.: 10/621,695

(22) Filed: Jul. 16, 2003

(65) Prior Publication Data

US 2005/0011451 A1 Jan. 20, 2005

(51) Int. Cl.[7] .............................................. H01J 7/24
(52) U.S. Cl. ........................... 315/111.21; 315/111.51; 324/652; 324/637; 156/345.48; 118/723 I; 24/298.08
(58) Field of Search ..................... 315/111.21, 111.51, 315/111.71; 324/652, 637, 633; 204/298.08, 298.34, 298.38; 219/121.36, 121.43; 156/345.44, 345.48; 118/723 E, 723 I

(56) References Cited

U.S. PATENT DOCUMENTS

| | | | | |
|---|---|---|---|---|
| 5,288,971 A | * | 2/1994 | Knipp | 219/121.57 |
| 5,339,039 A | * | 8/1994 | Carlile et al. | 324/655 |
| 5,849,136 A | * | 12/1998 | Mintz et al. | 156/345.44 |
| 5,889,252 A | * | 3/1999 | Williams et al. | 219/121.54 |
| 6,028,285 A | * | 2/2000 | Khater et al. | 219/121.43 |
| 6,345,588 B1 | * | 2/2002 | Stimson | 118/723 I |
| 6,388,382 B1 | * | 5/2002 | Doi et al. | 315/111.51 |
| 6,592,710 B1 | * | 7/2003 | Benjamin et al. | 156/345.48 |
| 6,758,948 B2 | * | 7/2004 | Johnson | 204/192.12 |

* cited by examiner

Primary Examiner—Haissa Philogene
(74) Attorney, Agent, or Firm—Benjamin Hudson, Jr.; John D. Pirnot

(57) ABSTRACT

There is provided a secondary reactive termination circuit connected between the output of the RF power generator and the input of the plasma chamber to allow the tight regulation or limiting of the voltage and current components of the secondary frequencies within the process plasma. The secondary reactive circuit controls the impedance of the match network designed primarily to operate at the fundamental frequency of the RF power generator as seen by secondary frequencies in the system. A variable capacitor gives the operator the advantage of being able to tightly regulate the voltage, current, and power within a process at discrete frequencies without concern for impedance variability induced by other components in the system.

4 Claims, 1 Drawing Sheet

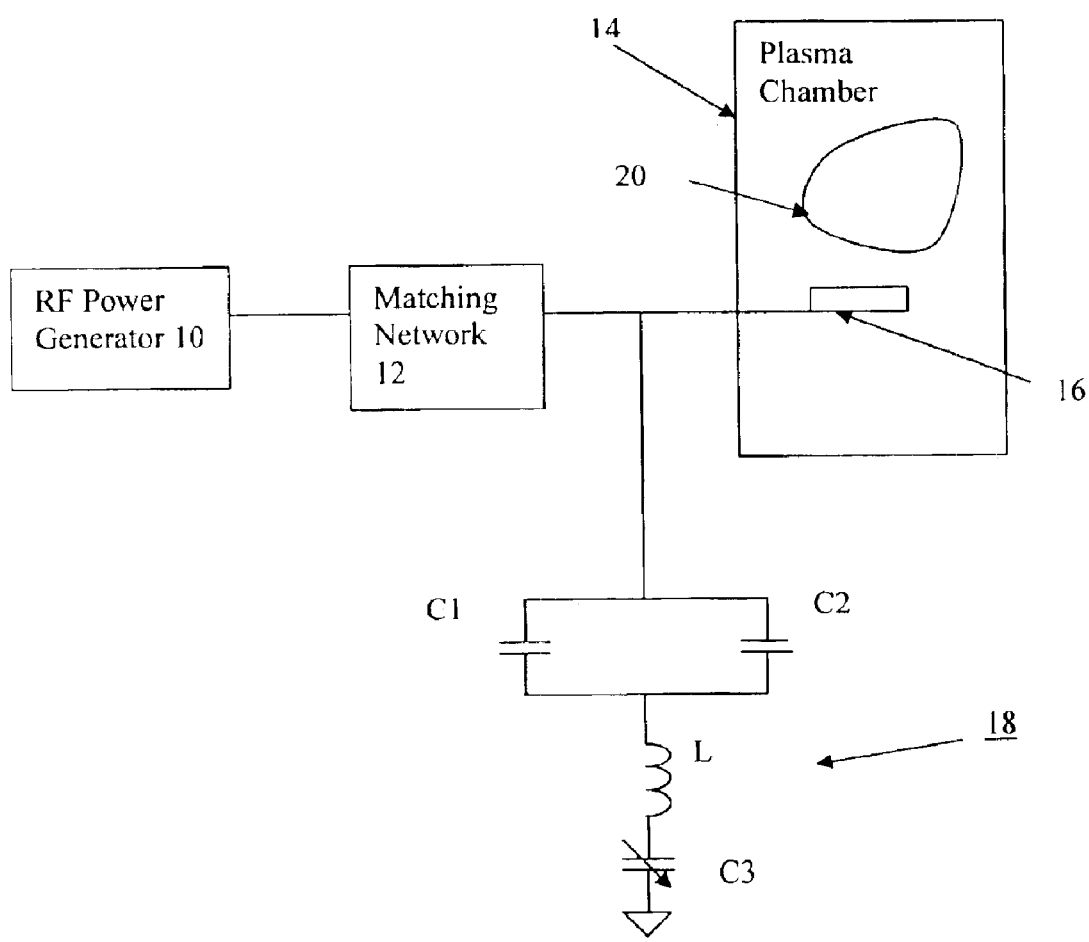

IMPEDANCE MATCHING NETWORK WITH TERMINATION OF SECONDARY RF FREQUENCIES

BACKGROUND OF THE INVENTION

1. Field of the Invention

This invention relates generally to apparatus for matching the variable impedance of a load, and more particularly to, apparatus for RF power delivery systems for plasma processes utilized in semiconductor or flat panel display manufacturing.

2. Brief Description of the Prior Art

In plasma processing applications such as the manufacture of semiconductors or flat panel displays, RF power generators apply a voltage to a load in a plasma chamber and may operate over a wide range of frequencies. The impedance of a plasma chamber can vary with the frequency of this applied voltage, chamber pressure, gas composition, and the target or substrate material. Consequently, a reactive impedance matching network is typically used to transform the chamber impedance to an ideal load for the RF power generator.

Multiple frequencies are always present in RF plasma processing systems. These different frequencies can be the result of harmonics of the fundamental operational frequency. In many applications, multiple frequencies can be the result of separate power delivery systems operating on the same tool. Common configurations on commercial plasma processing tools include, but are not limited to, dual frequency systems such as 13.56 MHz–350 kHz, 60 MHz–2 MHz, and 27.12 MHz–2 MHz. Due to the presence of different frequencies, it may be necessary to provide additional RF circuitry in components designed primarily to work within one frequency range to effect their termination impedance as seen by a separate frequency. Controlling this termination impedance allows the control or limiting of the voltage and current components of the secondary frequencies within the process plasma. Circuitry intended to terminate secondary frequencies must be designed such that it provides the desired termination impedance to the secondary frequencies without adversely affecting the performance of the component within its primary frequency range of operation.

It would be desirable if there were provided an impedance matching network that had the capability to set specific termination impedances for different frequencies within RF components on a plasma chamber that gave the operator the advantage of being able to tightly regulate the voltage, current, and power within a process at discrete frequencies without concern for impedance variability induced by other components in the system.

It would also be desirable if the matching network had the capability to suppress any undesirable effects caused by harmonics of the fundamental operational frequency.

SUMMARY OF THE INVENTION

There is provided by this invention the addition of a secondary, reactive, resonant circuit to matching network apparatus that allows tight control and repeatability of its impedance as seen by the network operating at secondary frequencies. This secondary circuit is designed in such a way that it does not cause undesirable interference, through conduction or radiation, with the operation of the match network at its fundamental operating frequency. The reactive, resonant circuit may be fixed or adjustable as required by the frequency application.

BRIEF DESCRIPTION OF THE DRAWING

FIG. 1 illustrates plasma apparatus that incorporates the principles of this invention.

BRIEF DESCRIPTION OF THE PREFERRED EMBODIMENT

Referring to FIG. 1 there is shown RF plasma processing apparatus that incorporates the principles of this invention that is generally comprised of an RF power generator 10 that supplies power to a substrate 16 mounted in a plasma chamber 14 in a manner well known to those skilled in the art. The chamber 14 is filled with a gas that ignites into plasma for depositing thin films on or etching material from the substrate 16. The matching network 12 is designed to provide an efficient transfer of power from the RF power generator 10 to the RF plasma load 20 in the chamber by matching the different impedances between the generator 10 and plasma load 20. A secondary termination circuit 18 is added between the output of the RF power generator 10 and the input of the plasma chamber 14 to provide specific impedance at a frequency or frequencies other than the fundamental operational frequency of the match network. The circuit 18 is generally comprised of parallel capacitors C1 and C2 series connected to an inductor L and a variable capacitor C3. In operation, circuit 18 controls the impedance of the match network 12 designed primarily to operate at the fundamental frequency of the RF power generator 10 as seen by secondary frequencies in the system.

It can readily be seen that there is provided herein a novel and unique implementation of a match network in an RF plasma processing system that utilizes an auxiliary resonant, reactive circuit that allows the control or limiting of the voltage and current components of secondary frequencies within the process plasma.

Although there is illustrated and described specific structure and details of operation, it is clearly understood that the same were merely for purposes of illustration and that changes and modifications may be readily made therein by those skilled in the art without departing from the spirit and the scope of this invention.

We claim:

1. An RF power delivery system for plasma processing comprising:

a) an RF power generator disposed to deliver power to a plasma chamber for creating a plasma to deposit thin films on a substrate;

b) an impedance matching network connected to the output of the RF power generator to provide an efficient transfer of power from the RF power generator to the plasma in the chamber by matching the impedance of the plasma to the operating impedance of the generator; and c) a secondary reactive termination circuit connected between the output of the RF power generator and the input of the plasma chamber to allow the tight regulation or limiting of the voltage and current components of secondary frequencies within the process plasma.

2. An RF power delivery system for plasma processing comprising as recited in claim 1 wherein the secondary reactive termination circuit is comprised a parallel connection of a first and second capacitor connected in parallel series connected to an inductor and a variable capacitor.

3. An RF power delivery system for plasma processing comprising as recited in claim 2 wherein the secondary reactive termination circuit controls the impedance of the matching network designed primarily to operate at the fundamental frequency of the RF power generator as seen by secondary frequencies in the system.

4. An RF power delivery system for plasma processing comprising as recited in claim 3 wherein a variable capacitor that allows tight regulation of the voltage, current, and power within a process at discrete frequencies without concern for impedance variability induced by other components in the system.

* * * * *